(12) United States Patent
Chen et al.

(10) Patent No.: US 9,047,437 B2
(45) Date of Patent: *Jun. 2, 2015

(54) METHOD, SYSTEM AND SOFTWARE FOR ACCESSING DESIGN RULES AND LIBRARY OF DESIGN FEATURES WHILE DESIGNING SEMICONDUCTOR DEVICE LAYOUT

(71) Applicant: TAIWAN SEMICONDUCTOR MANUFACTURING CO., LTD., Hsin-Chu (TW)

(72) Inventors: Chin-An Chen, Zhudong Township (TW); Pei-Tzu Wu, Hsinchu (TW); Tsung-Chieh Tsai, Chu-Bei (TW); Juing-Yi Wu, Hsinchu (TW); Jyh-Kang Ting, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,256

(22) Filed: May 28, 2014

(65) Prior Publication Data

US 2014/0282294 A1  Sep. 18, 2014

Related U.S. Application Data

(63) Continuation of application No. 13/285,528, filed on Oct. 31, 2011, now Pat. No. 8,769,475.

(51) Int. Cl.
*G06F 15/04* (2006.01)
*G06F 17/50* (2006.01)

(52) U.S. Cl.
CPC .................. *G06F 17/5081* (2013.01)

(58) Field of Classification Search
USPC ......................................... 716/139
See application file for complete search history.

(56) References Cited

U.S. PATENT DOCUMENTS

| | | | |
|---|---|---|---|
| 7,257,794 B2 | 8/2007 | Tang et al. | |
| 8,327,315 B1* | 12/2012 | Ghosh et al. | 716/139 |
| 2003/0182644 A1* | 9/2003 | Li et al. | 716/5 |
| 2004/0243374 A1 | 12/2004 | Kundert | |
| 2006/0136856 A1 | 6/2006 | Tang et al. | |
| 2008/0077901 A1* | 3/2008 | Arsintescu | 716/11 |

FOREIGN PATENT DOCUMENTS

| | | |
|---|---|---|
| TW | I306209 | 2/2009 |
| TW | I349864 | 10/2011 |

OTHER PUBLICATIONS

Office Action dated May 7, 2014 from related Taiwanese Patent Application No. 101119479, 4 pages.

* cited by examiner

*Primary Examiner* — Eric Lee
(74) *Attorney, Agent, or Firm* — Duane Morris LLP

(57) ABSTRACT

Provided is a system and method for designing the layout of integrated circuits or other semiconductor devices while directly accessing design rules and a library of design features by interfacing with a GUI upon which the design layout is displayed. The design rules may be directly linked to the design features of the pattern library and imported into the device layout. The design rules may be directly accessed while designing the layout or while conducting a design rule check and the design features from the pattern library may be used in creating the layout.

19 Claims, 4 Drawing Sheets

METHOD, SYSTEM AND SOFTWARE FOR ACCESSING DESIGN RULES AND LIBRARY OF DESIGN FEATURES WHILE DESIGNING SEMICONDUCTOR DEVICE LAYOUT

RELATED APPLICATION

This application is a continuation of U.S. patent application Ser. No. 13/285,528, filed on Oct. 31, 2011, the contents of which are hereby incorporated by reference as if set forth in their entirety.

TECHNICAL FIELD

The disclosure relates to a method, system and software for designing the layout of a semiconductor device.

BACKGROUND

The design of integrated circuits can be accomplished using various forms of electronic design automation software that allows the circuit designer to create and digitize the shapes and patterns that form an integrated circuit. Integrated circuits and other semiconductor devices consist of several overlaid layers of material and each layer, i.e. each device level, includes an associated layout that must be generated by the designers in cooperation with all of the other device levels, especially the level and features above and below it. The integrated circuit design must comply with several different design rules including rules associated with the device level being designed and rules associated with the interrelationship between the device level being designed and subjacent and superjacent device levels.

The design rules may be established by the customer or they may be established by the mask foundry which dictates the tolerances that the mask foundry can accept in generating the photomasks. The design rules may also be promulgated by the device fabrication facility, also referred to as a foundry, based on the capabilities of processing operations. There are many design rules and each of the design rules must be complied with, in order for a photomask set to be created such that an integrated circuit can be successfully fabricated using the mask set.

The number of design rules associated with an integrated circuit is increasing and design rules are becoming more complex as a result of narrower process windows and more layout-dependent effects taking place in processing operations in advanced technology. The totality of rules is challenging for circuit designers to comprehend collectively but according to conventional practices, this must be done prior to commencing the design of the layout. According to current practices, the designers first consult the design rule manuals which contain voluminous and complex design rules, then query the foundry or foundries for the meaning of the design rules, and then begin designing the layout. After an initial design layout implementation is carried out, a design rule check is performed and the circuit designers must again repeat the steps of consulting the design rule manual and querying the foundry or foundries regarding the design rules. Several iterations of the design process are typically required.

This produces a time-consuming, expensive and inefficient way of designing the layouts of integrated circuits. It would be desirable to address these limitations and shortcomings especially in view of the popularity and proliferation of integrated circuit devices used in various applications in today's world.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
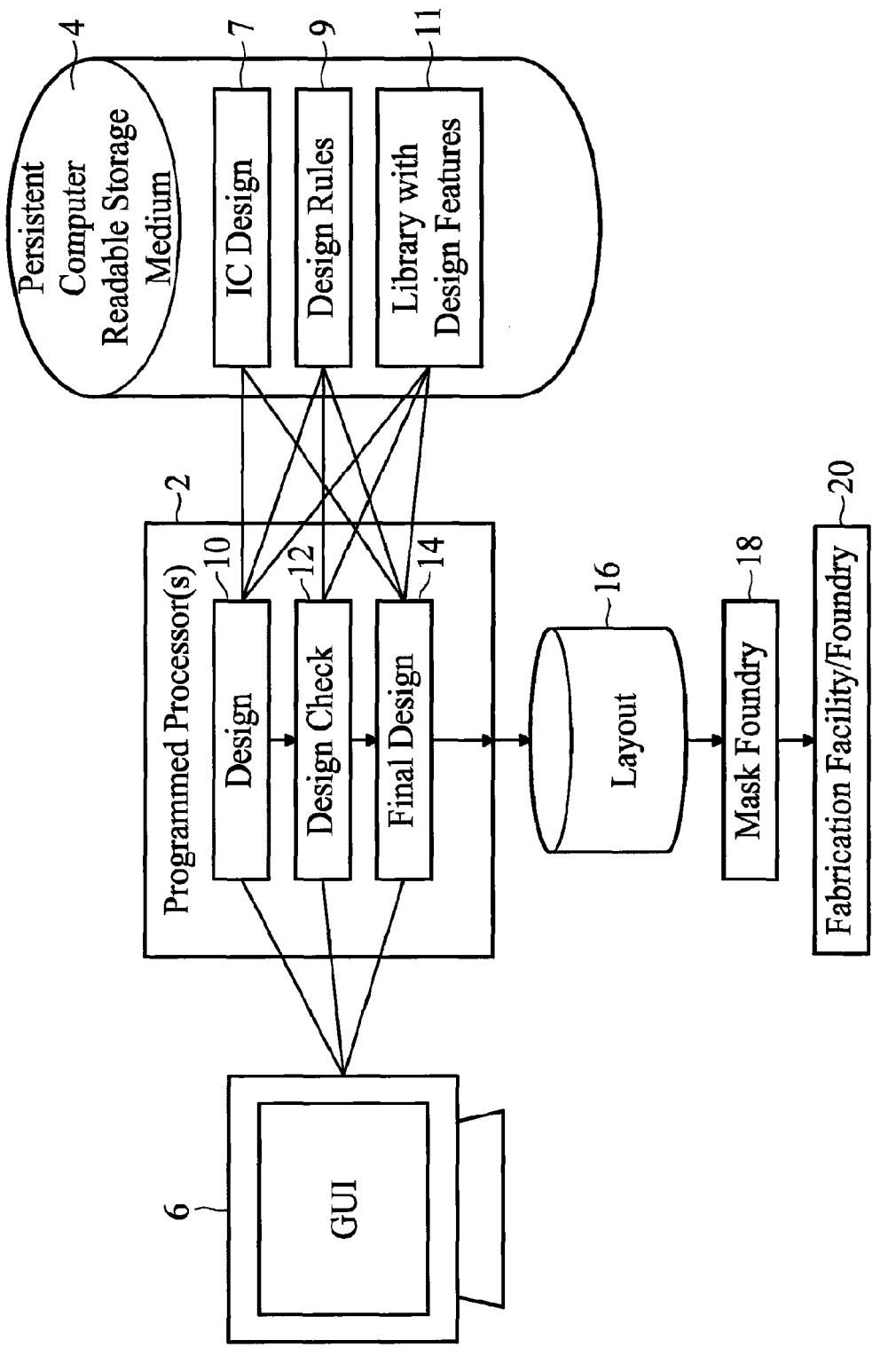
FIG. 1 is a schematic diagram illustrating a system and method according to an exemplary embodiment of the disclosure.

The disclosure provides a system, method and tangible and persistent computer readable storage medium for the design of integrated circuits and other semiconductor devices whereby, as the design is being implemented and/or as the design layout is displayed on a graphical user interface (GUI), design rules can be directly accessed by interacting with a GUI. The design rules are advantageously linked to a pattern library consistent with the design rules and features from the pattern library can be used to create the design layout or to modify the design layout. The pattern library can also be directly accessed by interacting with the GUI.

According to one aspect, the disclosure provides a tangible or persistent computer readable storage medium encoded with computer program code such that, when the computer program code is executed by a processor, the processor performs a design method for designing a layout of a semiconductor device such as an integrated circuit. The design method includes initially designing a semiconductor device layout and displaying the layout on a graphical user interface (GUI), accessing custom design rules associated with at least one foundry by interacting with the GUI when the semiconductor device layout is displayed, accessing a library of design features associated with the at least one foundry by interacting with the GUI and importing at least one of the design features directly into the semiconductor device layout displayed on the GUI.

The design rules may advantageously be directly linked to the library of design features. By interacting with the GUI, the design rules may be displayed on the GUI along with the semiconductor device layout. The design rules are custom design rules that may be associated with and provided by a photomask foundry or a semiconductor device manufacturing foundry, or both. The design features in the library may be captured and imported directly into the semiconductor device layout. This capturing and importing may assist the circuit designer in creating the semiconductor device layout or this may be carried out during a design check, e.g. after an initial semiconductor device layout is created by the designer, the software enables the designer to access the design rules to check the created semiconductor device layout and to access the library and import features from the design library directly into the semiconductor device layout. The custom design rules and design features may be provided by the foundries to a customer for carrying out the design and represent foundry process verified design rules and design features. The designer can access and use the design rules and design library before, during or after commencing designing the semiconductor device layout on the GUI.

The disclosure also provides a method for designing a semiconductor device. The method comprises designing the layout of a semiconductor device and displaying the layout on a graphical user interface (GUI) using an electronic design automation (EDA) system. The method further comprises accessing custom design rules associated with a foundry by interacting with the GUI when the layout is displayed, accessing a library of design features by interacting with the GUI when the layout is displayed and importing at least one desired design feature from the library of design features into the layout by selecting the at least one desired design feature from the library and importing the at least one desired design feature into the layout by interacting with the GUI.

The disclosure also provides an electronic design automation (EDA) system. The system comprises a processor, a GUI, and a tangible or persistent computer readable storage medium. The tangible or persistent computer readable storage medium is encoded with computer program code such that, when the computer program code is executed by the processor, the processor enables a user to use the EDA system to design a layout of a semiconductor device. The design may be carried out according to a method comprising performing a design of a semiconductor device layout; accessing custom design rules such as may be process verified design rules associated with a foundry by interacting with the GUI; accessing a library of design features associated with the foundry by interacting with the GUI; and importing at least one of the design features directly into the semiconductor device layout by interacting with the GUI.

Interaction with the GUI may be carried out using future developed means or known means such as using a physical input device to control the position of a cursor on the semiconductor device layout displayed on the GUI, positioning the cursor on a feature of the displayed semiconductor device layout and selecting the feature by clicking on the cursor using a mouse or other suitable device, thereby causing the custom design rule or library or both, to be accessed and displayed on the GUI along with the display of the semiconductor device layout. Design features of the library may be imported by clicking on the desired design feature and dragging the feature into the desired location on the displayed semiconductor device layout, or copying the desired design feature and pasting the feature into the displayed semiconductor device layout, or by using other suitable GUI interface means and methods.

FIG. 1 is a schematic overview showing details of an exemplary embodiment of the disclosure. An EDA tool may include programmed processor 2 with persistent computer readable storage medium 4 installed, and GUI 6. Persistent computer readable storage medium 4 is computer software that enables a designer to design and modify an integrated circuit device layout or other semiconductor device layout. An integrated circuit device layout includes layouts of multiple individual device levels overlaid over one another.

The software of persistent computer readable storage medium 4 may be commercially available IC Layout Editor in one exemplary embodiment but other suitable electronic design automation software tools may be used in other exemplary embodiments. Persistent computer readable storage medium 4 is encoded with computer program code such that, when the computer program code is executed by processor 2, processor 2, in conjunction with a user interfacing with the system using GUI 6, performs a design method for designing a layout of an integrated circuit or other semiconductor device. The design method may be computer aided design method in which a user and the processor utilize IC design software, i.e. a software tool that allows a user to digitize shapes and patterns that form an integrated circuit (IC Design 7). The software further provides for directly accessing design rules (Design Rules 9) and a Library with Design Features 11 while carrying out the IC Design.

The user, i.e. circuit designer, interfaces with GUI 6 to carry out at least the steps of design 10, design check 12 and final design 14 using programmed processor 2. According to one aspect, the step of design 10 involves designing the layout of a semiconductor device such as an integrated circuit, i.e. digitally creating the shapes, patterns, locations and sizes of features that combine to form the semiconductor device such as an integrated circuit. After an initial layout has been designed, design check 12 is carried out wherein the initially designed layout is checked and may be modified, and a final layout is generated at final design 14. The IC Design software i.e. the software tool that allows a user to digitize shapes and patterns that form an integrated circuit, may be used and the design rules 9 and library of design features 11 directly accessed during the steps of design 10 and final design 14. The design rules 9 and library with design features 11 may also be directly accessed during the step of design check 12. Design 10 may include first accessing design rules 9 and library with design features 11, prior to carrying out IC design 7.

The method for accessing the design rules and accessing and importing design features from the library with design features 11 into the semiconductor device layout displayed on the GUI will be described in further detail below.

Final design 14 generates layout 16 which represents the layout of an integrated circuit or other semiconductor device having multiple device levels. Layout 16 is an electronic file which may be in various suitable formats and includes instructions for generating a set of photomasks, each used to form an individual device layer such that when the layers are overlaid, a completed integrated circuit or other semiconductor device is formed. Layout 16 is provided to mask foundry 18 which generates the set of photomasks useable to form an integrated circuit or other semiconductor device. The photomasks generated by mask foundry 18 are provided to the fabrication foundry, i.e. fabrication facility/foundry 20 where a succession of processing operations are carried out using the set of photomasks to form the integrated circuit or other semiconductor device.

Still referring to FIG. 1, design rules 9 may appear in a rule-file in text format that may be displayed along with the layout on the GUI including the initial layout. The pattern library (library with design features 11) may include features in GDSII (Graphic Database System II) or OASIS (Open Artwork System Interchange Standard) format or other suitable industry standards for data exchange of integrated circuit layout artwork. The rule-file of design rules 9 and the pattern library 11 are directly accessible while implementing the design. The rule-file of design rules 9 and pattern library 11 may be accessed by clicking on an existing feature of the layout on the GUI, by selecting a design rule from a table of a set of design rules displayed on the GUI, by inputting another command or using other means. The rule-file of design rules 9 and pattern library 11 may be accessible and installed in electronic design automation software that also allows a designer to digitize the shapes and patterns that form an integrated circuit. An example of such electronic design automation software is IC Layout Editor but the rule-file and pattern library may be accessible and installed in other suitable electronic design automation software tools. The electronic design automation software is considered to be computer-aided drafting software specialized for the task of integrated circuit layout. Various electronic design automation (EDA) systems for implementing the computer aided drafting software may be used.

Figure 2:
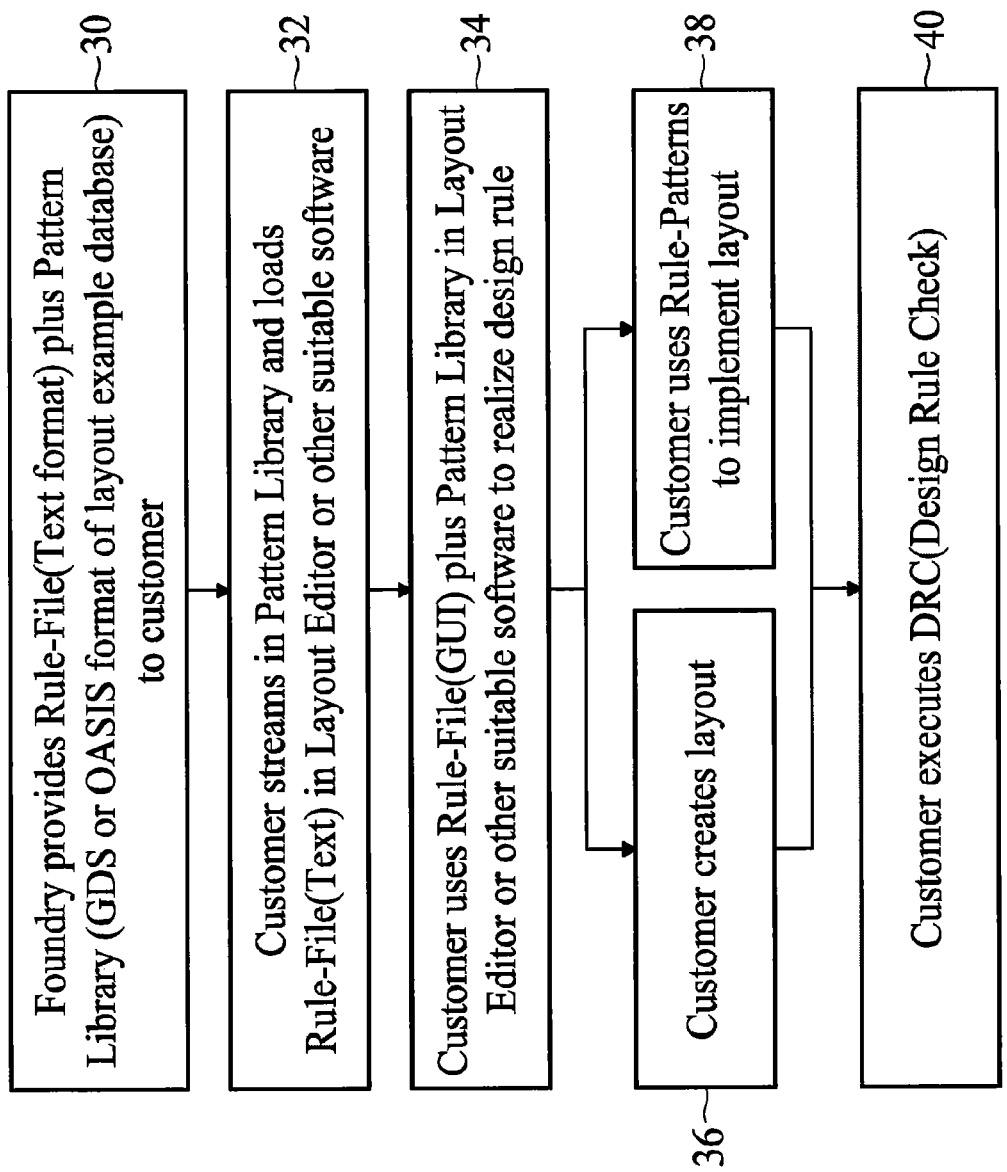
FIG. 2 is a flowchart showing details of an exemplary method according to an exemplary embodiment of the disclosure.

FIG. 2 is a flow chart of a method according to some embodiments of the disclosure. At step 30, the foundry provides a rule-file of design rules and a pattern library containing design features to the customer, i.e. the circuit designer. The foundry may be a mask foundry or the device fabrication facility. The rule-file is in text format and the pattern library in GDS or OASIS format as in the illustrated flow chart, but such is exemplary only and other file formats for data exchange of integrated circuit artwork may alternatively be used. The customer may prescribe the database to be used depending upon the processor and EDA system to be used. At step 32, the customer loads or installs the pattern library and rule-file in the electronic design automation software tool such as IC Layout Editor or other suitable software. Various other electronic design automation software tools that enable the customer to carry out computer aided drafting of integrated circuit layouts may be used. At step 34, the customer may access the rule-file and pattern library to realize the design rules, by interacting with a GUI that will also be used to carry out the design implementation and display the designed layout. The design rules and pattern library containing design features can be directly accessed while also using IC Layout Editor or the other electronic design automation software tools, to actively carry out the design of the semiconductor device layout. The EDA system may include a software module that receives the computer readable storage medium and includes the rule file of design rules and pattern library.

With the design rules and pattern library with design features so accessible, the design layout is created at step 36 and the pattern library is used to implement the layout at step 38. Steps 36 and 38 appear in parallel to represent two exemplary embodiments for utilizing the rule-file and pattern library accessible in step 34. According to one embodiment, the circuit designer can first create the layout as in step 36 and then access the design rules and pattern library after the layout is created at step 40. According to another exemplary embodiment, the design features from the pattern library can be actively used in carrying out the design of the layout such as in step 38. The pattern library may be accessed directly or by accessing the design rules which are linked directly or indirectly to the pattern library. The design rules may be linked to the pattern library using various available electronic linking means and formats such as single field format (e.g. rule number) or multiple field format in which the field may include rule number, description, various labels, layout cell name, and the like.

At step 40, a design rule check is executed. During step 40, the design rules may be directly accessed, the library of design features may also be directly accessed and the layout may be revised. After one or more iterations, a final design may be implemented and this design can be checked against the design rules and the library of design features. According to the method following step 36 and according to the method following step 38, the layout is created and displayed on a GUI and the design rules and library of design features are directly accessed and displayed on the GUI as will be shown in FIGS. 3 and 4.

Figure 3:
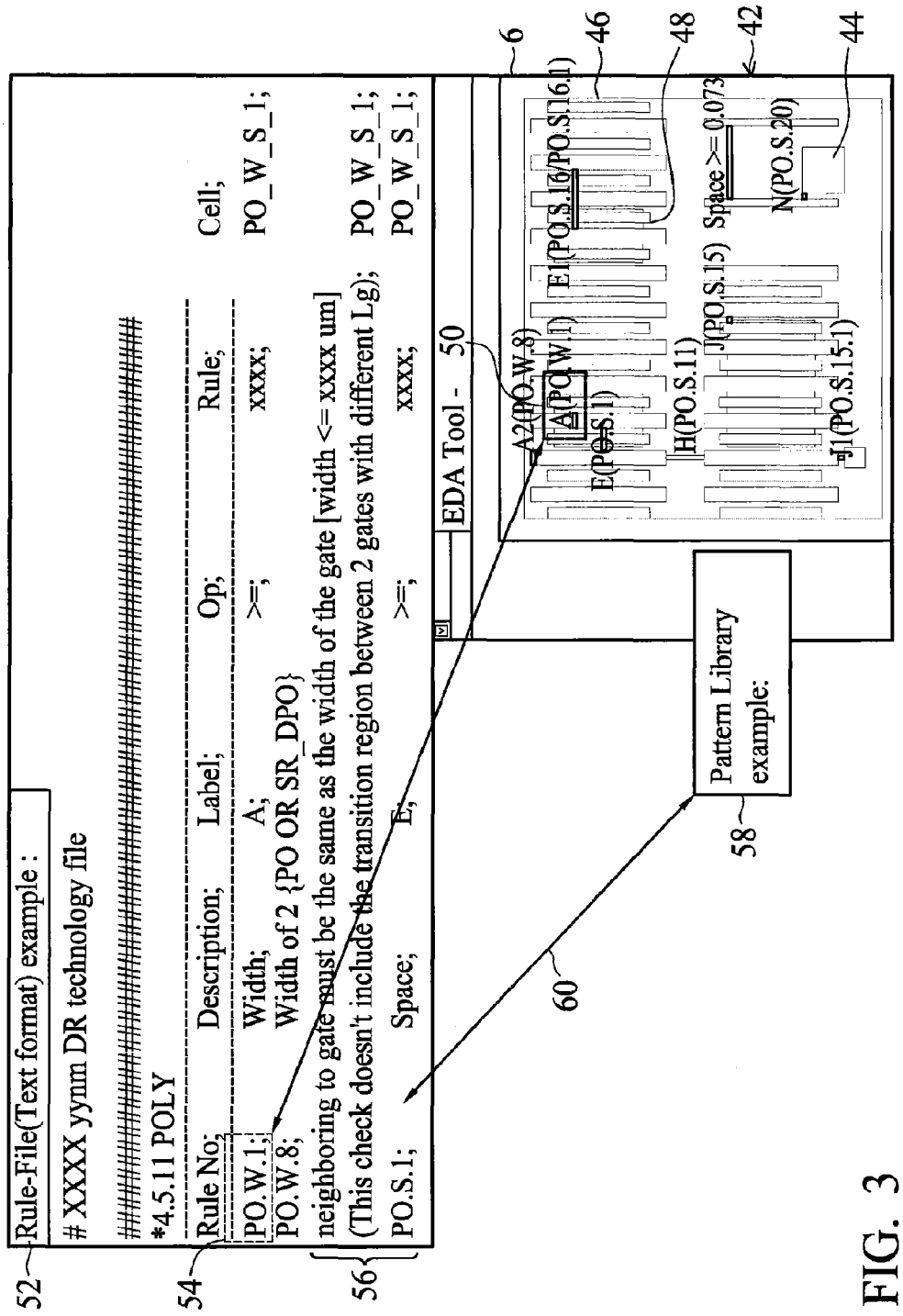
FIG. 3 shows a GUI displaying a portion of a design layout and schematically illustrates a rule-file accessed by interaction with the GUI according to an exemplary embodiment of the disclosure.

FIG. 3 shows GUI 6 displaying a portion of design layout 42. Displayed design layout 42 includes multiple features such as arbitrarily designated design features 44, 46 and 48 and is exemplary only. Design features 44, 46 and 48 may be from various different device levels overlaid over one another. GUI 6 may be any of various suitable graphical user interfaces such as commercially available and may be part of an EDA tool. GUI 6 may advantageously be a graphical user interface chosen in conjunction with the EDA system and the electronic design automation software tools used to create integrated circuit devices. Design features 44, 46 and 48 are representative of the various design features such as well areas, source/drain areas, other active areas, transistor gates, interconnect lines, bus lines, capacitor plates, spaces, contacts, vias, and various other features and their relationships to one another. Design layout 42 includes features and notations that are representative of the various design features and other notations that may appear on a design layout.

In the illustrated embodiment, box 50 represents a portion of design layout 42 of interest, i.e. a portion of design layout 42 for which a query of the design rules is being made. A physical input device such as a mouse or keyboard may be used to position a cursor at the location of box 50 and a physical input action such as clicking a mouse can be used to directly access and display rule-file 52 on GUI 6. Rule-file 52 may be in table format and include various design rules such as polysilicon line spacing rules or contact rules. Rule-file 52 may include design rule 54 associated with the features in box 50, and text 56 explaining the same. The designer may review the table of rule-file 52 on GUI 6 and select the appropriate design rule to be directly applied to design layout 42.

In the illustrated embodiment, the design rule and the features in box 50 are two parallel poly leads in which the width and spacing design rules are queried, but this is exemplary only. The design rules may cover minimum or maximum widths of features, number of parallel features allowed in a fixed area, spacings between features, alignment tolerances between contacts or vias and underlying or overlying leads and the design rules may cover various other layout criteria such as a minimum number of lines that can be formed in parallel for nesting purposes, or various other design rules. Integrated circuit design includes a countless number of design rules and the preceding rules are exemplary only. The design rules may be provided by a photomask foundry based on the capability of the photomask foundry to produce masks. The mask set may include a single reticle per device layer or one or more of the device layers may be produced using DPL, double patterning lithography, using two or more photomasks to produce a single pattern in a layer. The design rules may also pertain to the relationship and tolerances between the two masks used for one layer in DPL processing. Rule-file 52 is displayed in text format in the illustrated embodiment in which the rules are listed and presented in a table. This is exemplary only and various other formats may be used. In various exemplary embodiments, rule-file 52 may be linked to pattern library 58 via link 60. Pattern library 58 is shown in more detail in FIG. 4. According to one exemplary embodiment, when a rule such as design rule 54 is accessed by selecting design rule 54 by positioning a cursor on box 50 of design layout 42, a corresponding pattern library of design features is also automatically accessed and may be displayed because of link 60 between rule-file 52 and pattern library 58.

Figure 4:
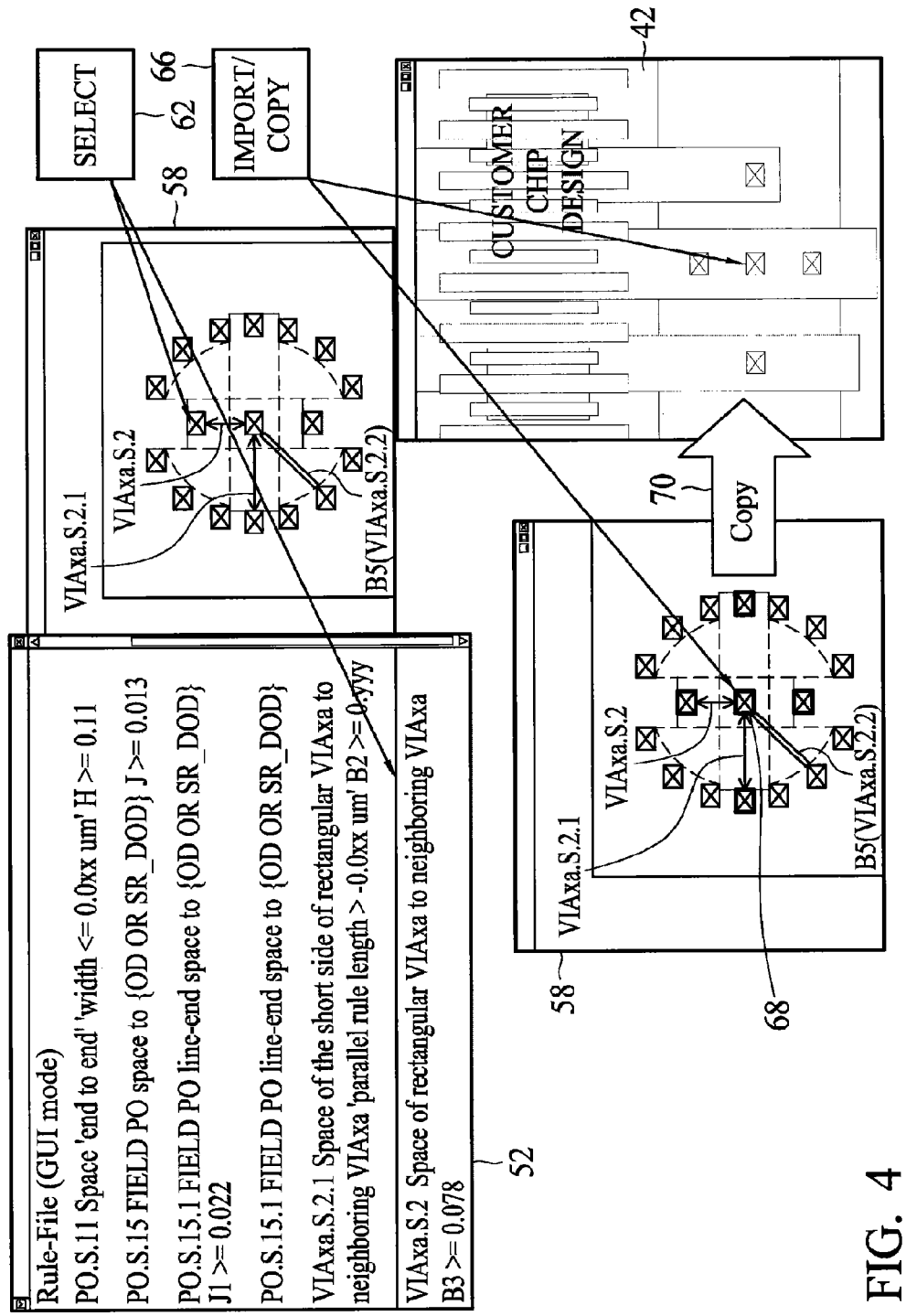
FIG. 4 shows a GUI displaying a portion of a design layout, a graphical representation of a rule-file being accessed and a graphical representation of a pattern library with a design feature being imported into the design layout of the GUI according to an exemplary embodiment of the disclosure.

FIG. 4 shows design layout 42 displayed on GUI 6. FIG. 4 shows how a design rule and design feature from a pattern library can be accessed directly by a user interfacing with a GUI and how a design feature from the pattern library can be copied onto design layout 42. The design rule from rule-file 52 is linked to a design feature in the pattern library 58 (see FIG. 3) which can be used to create or modify design layout 42. At selection step 62, a portion of a design layout such as highlighted in box 50 of FIG. 3, is accessed and highlighted by a physical input device that interacts with the feature to directly access rule-file 52 which contains design rules and is linked to pattern library 58. By clicking on or otherwise selecting box 50, the relevant design rule of rule-file 52 is displayed. Pattern library 58 includes various design features that comply with and are linked to the design rules of rule-file 52. By selecting a feature of interest of design layout 42, the user can query the database to directly access and display rule-file 52 and pattern library 58 on the same GUI on which design layout 42 appears. Because rule-file 52 and pattern library 58 are directly linked, by clicking on or otherwise selecting box 50, along with the relevant design rule of rule-file 52, one or more associated design features of pattern library 58 is also displayed.

At the import/copy step 66, desired design feature 68 is selected and accessed from pattern library 58 and imported into design layout 42 displayed on GUI 6. At step 70, a copy of desired design feature 68 is made and imported onto an appropriate location in design layout 42 on GUI 6. A physical input device may be used to select desired design feature 68 and to copy the feature onto design layout 42 of GUI 6. Desired design feature 68 may be dragged using various GUI interface techniques or it may be copied and pasted into the appropriate location. Desired design feature 68 represents a feature that complies with the design rules for the corresponding technology and is a process-verified feature.

The direct accessing of the design rules from rule-file 52 and the direct accessing of pattern library 58 and the copying of desired design feature 68 may take place during the initial design of an integrated circuit layout or it may take place after an initial layout has been created, or both. The direct accessing of the design rules from rule-file 52 and the direct accessing of pattern library 58 may be displayed on a GUI to serve as a starting point for circuit designers as a result of the software which advantageously provides for directly accessing and displaying design rules and the pattern library while designing the device layout.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A non-transitory computer readable storage medium encoded with computer program code such that, when said computer program code is executed by a processor, said processor performs a semiconductor device design method, said design method comprising:
    accessing design rules by interacting with a graphical user interface (GUI) by selecting a feature of a semiconductor device layout when said semiconductor device layout is displayed on said GUI,
    wherein said accessing said design rules automatically accesses a library of design features, and wherein the semiconductor device layout is used to form a photomask set.

2. The non-transitory computer readable storage medium as in claim 1, wherein said design rules are linked to said library of design features, said method further comprises designing said semiconductor device layout, and wherein said automatically accessing said library of design features by interacting with said GUI comprises using at least one of said design features in said designing a semiconductor device layout.

3. The non-transitory computer readable storage medium as in claim 1, wherein said method further comprises designing said semiconductor device layout and importing at least one of said design features directly into said semiconductor device layout and wherein said designing, said accessing design rules and said importing take place simultaneously and said method further comprises performing a design rule check and finalizing said layout in compliance with said design rules.

4. The non-transitory computer readable storage medium as in claim 1, wherein said design rules are linked to a library of design features and further comprising importing at least one of said design features directly into said semiconductor device layout.

5. The non-transitory computer readable storage medium as in claim 1, wherein said method further comprises causing a library of design features to be displayed on said GUI and wherein said accessing design rules comprises causing said design rules to be displayed on said GUI and includes positioning a cursor on a desired design feature of said design features to select a desired design feature.

6. A method for designing a semiconductor device, said method comprising:
    accessing design rules by interacting with a graphical user interface (GUI) by selecting a feature of a layout of a semiconductor device when said layout is displayed on said GUI and displaying a library of design features on said GUI when said layout is displayed, wherein said accessing design rules automatically accesses said library of design features, and wherein the layout is used to form a photomask set.

7. The method as in claim 6, wherein said design rules are linked to said library of design features.

8. The method as in claim 6, further comprising designing said layout and displaying said layout on said GUI using an electronic design automation (EDA) system.

9. The method as in claim 8, wherein said designing said layout and said displaying said layout on a GUI using an electronic design automation (EDA) system includes:
provokeproviding a tangible computer readable storage medium to a processor of said EDA system, said tangible computer readable storage medium encoded with computer program code such that, when said computer program code is executed by said processor, said processor enables a user to use said EDA system to perform said designing said layout and said displaying said layout on a GUI, and said accessing design rules, by interacting with said GUI.

10. The method as in claim 6, further comprising importing at least one desired design feature from said library of design features by selecting said at least one desired design feature from said library and importing said at least one desired design feature into said layout by interacting with said GUI.

11. The method as in claim 10, wherein said importing at least one desired design feature comprises forming a finalized layout that complies with said design rules and includes at least one of said design features, and further comprising using said photomask set to form a semiconductor device.

12. The method as in claim 6, wherein said accessing design rules comprises positioning a cursor on a portion of said layout and clicking a mouse, and further comprising checking said layout for compliance with said design rules by interacting with said GUI.

13. The method as in claim 6, wherein said accessing design rules comprises displaying said design rules on said GUI, and said design rules are process verified design rules associated with mask manufacturing and device fabrication.

14. The method as in claim 6, wherein said design rules are linked to said design features and said accessing design rules takes place prior to designing said layout.

15. The method as in claim 6, further comprising importing at least one desired design feature of said design features into said layout by interacting with said GUI, wherein said importing takes place during designing said layout, and further comprising performing a design rule check and finalizing said layout.

16. An electronic design automation (EDA) system comprising:
a processor;
a graphical user interface (GUI);
a non-transitory computer readable storage medium encoded with computer program code configured to be executed by said processor to enable a user to use said EDA system to design a semiconductor device layout according to a method comprising:
accessing design rules by interacting with said GUI by selecting a feature of said semiconductor device layout and displaying a library of design features on said GUI when said semiconductor device layout is displayed on said GUI,
wherein said design rules are associated with said device features and said accessing design rules automatically accesses said library and causes said library to be displayed on said GUI, and wherein the semiconductor device layout is used to form a photomask set.

17. The EDA system as in claim 16, wherein said design rules are further associated with photomask manufacturing and device fabrication.

18. The EDA system as in claim 16, wherein said method further comprises importing at least one of said design features directly into said semiconductor device layout by interacting with said GUI, and wherein said design rules are linked to said library of design features.

19. The EDA system as in claim 16, wherein said method further comprises performing a design of said semiconductor device layout, displaying said semiconductor device layout on said GUI and comparing at least one of said design rules to at least one feature of said semiconductor device layout.

\* \* \* \* \*